(12) United States Patent
Lee

(10) Patent No.: US 11,652,117 B2
(45) Date of Patent: May 16, 2023

(54) IMAGE SENSING DEVICE

(71) Applicant: SK hynix Inc., Icheon-si (KR)

(72) Inventor: Jong Kwan Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 470 days.

(21) Appl. No.: 16/940,712

(22) Filed: Jul. 28, 2020

(65) Prior Publication Data

US 2021/0242257 A1 Aug. 5, 2021

(30) Foreign Application Priority Data

Feb. 4, 2020 (KR) .................. 10-2020-0013094

(51) Int. Cl.
*H01L 27/146* (2006.01)
*H04N 5/355* (2011.01)

(52) U.S. Cl.
CPC .... *H01L 27/14612* (2013.01); *H01L 27/1463* (2013.01); *H01L 27/14603* (2013.01); *H01L 27/14609* (2013.01); *H01L 27/14641* (2013.01); *H01L 27/14643* (2013.01); *H04N 5/3559* (2013.01)

(58) Field of Classification Search
None
See application file for complete search history.

(56) References Cited

U.S. PATENT DOCUMENTS

| | | | |
|---|---|---|---|
| 2007/0023798 A1* | 2/2007 | McKee | H01L 27/14609 348/E3.018 |
| 2018/0130839 A1* | 5/2018 | Mauritzson | H01L 27/14 |
| 2018/0213173 A1* | 7/2018 | Oh | H01L 27/14627 |
| 2018/0302578 A1 | 10/2018 | Ebihara | |
| 2019/0148448 A1* | 5/2019 | Lee | H01L 27/14607 257/431 |
| 2019/0386057 A1* | 12/2019 | Wang | H01L 27/14641 |
| 2020/0007804 A1* | 1/2020 | Guidash | H04N 5/378 |
| 2020/0106971 A1* | 4/2020 | Winzenread | H04N 5/378 |
| 2020/0227454 A1* | 7/2020 | Geurts | H01L 27/14603 |

(Continued)

FOREIGN PATENT DOCUMENTS

| CN | 110661982 A | * 1/2020 | .......... H04N 5/2353 |
|---|---|---|---|
| KR | 10-2019-0004089 A | 1/2019 | |

*Primary Examiner* — Scott B Geyer
(74) *Attorney, Agent, or Firm* — Perkins Coie LLP

(57) ABSTRACT

An image sensing device is disclosed. The image sensing device includes a first unit pixel provided with a first photoelectric conversion element and a first floating diffusion region, a second unit pixel provided with a second photoelectric conversion element and a second floating diffusion region, a third unit pixel provided with a third photoelectric conversion region and a third floating diffusion region, and a fourth unit pixel provided with a fourth photoelectric conversion element and a fourth floating diffusion region. The first to fourth unit pixels are isolated from each other by a first device isolation structure. The first to fourth floating diffusion regions are coupled to a common floating diffusion node through conductive lines. At least one unit pixel among the first to fourth unit pixels includes a conversion gain transistor coupled to the common floating diffusion node and configured to adjust capacitance of the common floating diffusion node in response to a gain control signal provided to the conversion gain transistor.

20 Claims, 8 Drawing Sheets

(56) References Cited

U.S. PATENT DOCUMENTS

2020/0251512 A1* 8/2020 Im ..................... H01L 27/14638
2021/0005652 A1* 1/2021 Gu ..................... H01L 27/14616
2021/0160448 A1* 5/2021 Seo ........................ H04N 5/378

* cited by examiner

IMAGE SENSING DEVICE

CROSS-REFERENCE TO RELATED APPLICATION

This patent document claims the priority and benefits of Korean patent application No. 10-2020-0013094, filed on Feb. 4, 2020, which is hereby incorporated in its entirety by reference.

TECHNICAL FIELD

The technology and implementations disclosed in this patent document generally relate to an image sensing device.

BACKGROUND

An image sensor is a semiconductor device for converting an optical image into electrical signals. In recent times, with the increasing development of computer industries and communication industries, demand for high-quality and high-performance image sensors is rapidly increasing in various fields, for example, digital cameras, camcorders, personal communication systems (PCSs), game consoles, surveillance cameras, medical micro-cameras, robots, etc.

Image sensing devices may be broadly classified into CCD (Charge Coupled Device)-based image sensors and CMOS (Complementary Metal Oxide Semiconductor)-based image sensors. The CMOS image sensors have simpler and more convenient driving schemes, and thus may be preferred in some applications. Also, CMOS image sensors may integrate a signal processing circuit into a single chip, making it easy to miniaturize CMOS image sensors for implementation in a product with the added benefits of consuming very low power. CMOS image sensors can be fabricated using CMOS fabrication technology, which results in low manufacturing costs. CMOS image sensors have been widely used and designed to implement high-resolution images while CMOS image sensors have been intensively researched.

In addition, as the image resolution of the CMOS image sensor gradually increases, each pixel is gradually reduced in size in a manner that the number of pixels can increase without increasing the chip size.

SUMMARY

Various embodiments of the disclosed technology relate to an image sensing device having a high dynamic range, which can acquire low-illuminance and high-illuminance characteristics by adjusting a conversion gain.

Various embodiments of the disclosed technology relate to an image sensing device having a new layout structure capable of adjusting a conversion gain in a shared pixel structure configured to share floating diffusion (FD) regions.

In accordance with an embodiment of the disclosed technology, an image sensing device may include a first unit pixel including a first photoelectric conversion element configured to generate photocharges in response to incident light, and a first floating diffusion region configured to receive photocharges generated by the first photoelectric conversion element, a second unit pixel including a second photoelectric conversion element configured to generate photocharges in response to incident light, and a second floating diffusion region configured to receive photocharges generated by the second photoelectric conversion element, a third unit pixel including a third photoelectric conversion element configured to generate photocharges in response to incident light, and a third floating diffusion region configured to receive photocharges generated by the third photoelectric conversion element, and a fourth unit pixel including a fourth photoelectric conversion element configured to generate photocharges in response to incident light, and a fourth floating diffusion region configured to receive photocharges generated by the fourth photoelectric conversion element. The first to fourth unit pixels may be isolated from each other by a first device isolation structure. The first to fourth floating diffusion regions may be coupled to a common floating diffusion node through conductive lines. At least one unit pixel among the first to fourth unit pixels may include a conversion gain transistor coupled to the common floating diffusion node and configured to adjust capacitance of the common floating diffusion node in response to a gain control signal provided to the conversion gain transistor.

In accordance with another embodiment of the disclosed technology, an image sensing device may include a plurality of pixel groups arranged in a first direction and a second direction perpendicular to the first direction. Each pixel group may include unit pixels that are isolated from one another by a first device isolation structure. Each of the unit pixels may include a photoelectric conversion element configured to generate photocharges by performing photoelectric conversion of incident light, a floating diffusion region configured to receive the photocharges, and a transfer transistor configured to transmit the photocharges generated by the photoelectric conversion element to the floating diffusion region. The floating diffusion regions of the unit pixels may be coupled to a common floating diffusion node through conductive lines. At least one of the unit pixels may include a conversion gain transistor configured to adjust capacitance of the common floating diffusion node in response to a gain control signal provided to the conversion gain transistor.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of an image sensing device and the disclosed features may be implemented to substantially address one or more issues due to limitations and disadvantages of various image sensing devices. Some implementations of the disclosed technology may suggest designs of an image sensing device having a high dynamic range, which can acquire low-illuminance and high-illuminance characteristics by adjusting a conversion gain. Some implementations of the disclosed technology may be used to provide designs of an image sensing device having a new layout structure capable of adjusting a conversion gain in a shared pixel structure in which floating diffusion (FD) regions are shared. For example, the disclosed technology provides various implementations of an image sensing device which can improve operational characteristics thereof, and also provides various implementations of an image sensing device which can adjust a conversion gain without increasing the size of pixels within a shared structure in which a plurality of pixels shares floating diffusion (FD) regions.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Figure 1:
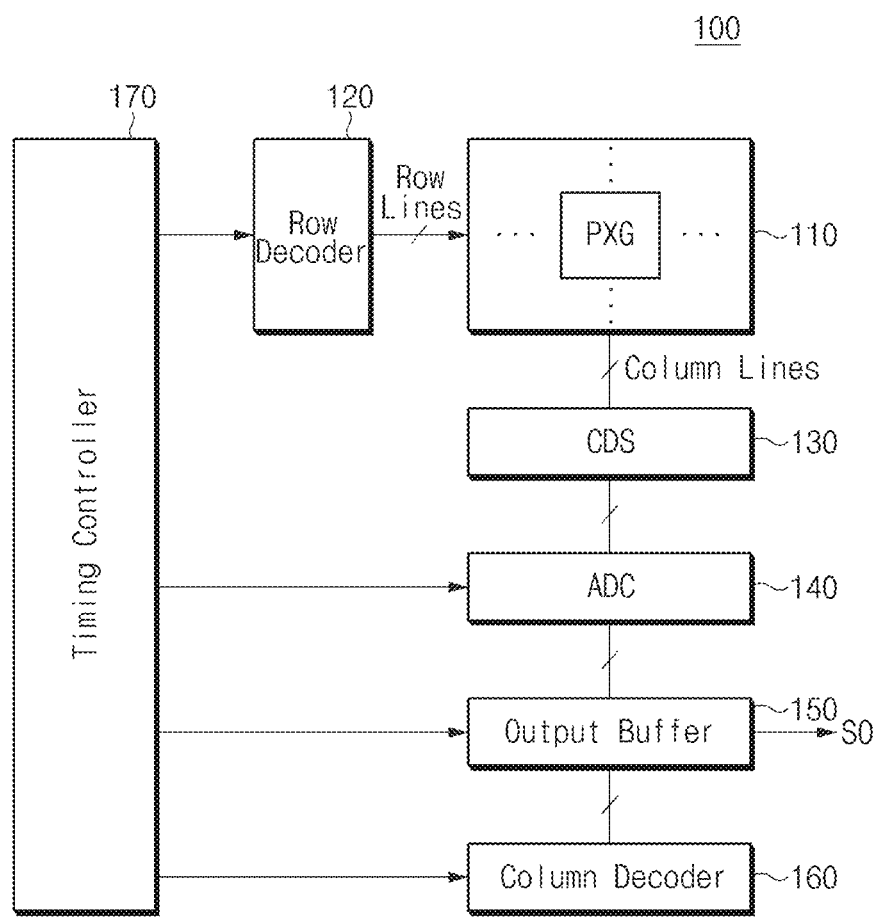
FIG. 1 is an example of a block diagram illustrating an image sensing device based on some implementations of the disclosed technology.

FIG. 1 is a block diagram illustrating an example of an image sensing device 100 based on some implementations of the disclosed technology.

Referring to FIG. 1, the image sensing device 100 may include a pixel array 110, a row decoder 120, a correlated double sampler (CDS) circuit 130, an analog-to-digital converter (ADC) circuit 140, an output buffer 150, a column decoder 160, and a timing controller 170. In this case, the above-mentioned constituent elements of the image sensing device 100 are disclosed only for illustrative purposes, and at least some elements may be added to or omitted from the image sensing device 100 as necessary.

The pixel array 110 may include a plurality of pixel groups (PXGs) consecutively and repeatedly arranged in a matrix shape. Each pixel group (PXG) may include a plurality of unit pixels to convert incident light received from outside into an electrical signal. Each unit pixel may include a photosensing pixel to generate photocharges by converting incident light into an electrical signal. The unit pixels contained in each pixel group (PXG) may be shared pixels in which floating diffusion (FD) regions respectively formed in the unit pixels are coupled to each other through conductive lines. Each of the unit pixels may receive a drive signal including a selection signal, a reset signal, a transmission signal, and a gain control signal, etc. from the row decoder 120 through row lines, and may be driven by the drive signal.

The row decoder 120 may drive the pixel array 110 upon receiving a control signal from the timing controller 170. In particular, the row decoder 120 may select at least one row line from among a plurality of row lines of the pixel array 110. In order to select at least one row line from among the plurality of row lines, the row decoder 120 may generate a row selection signal. The row decoder 120 may sequentially enable the pixel reset signal and the transmission signal for pixels corresponding to the at least one selected row line. Therefore, an analog reference signal and an analog image signal may be generated by each of the pixels contained in the selected row line, such that the analog reference signals and the analog image signals generated by the respective pixels contained in the selected row line can be sequentially transferred to the correlated double sampler (CDS) circuit 130. In this case, the reference signal and the image signal generated by each pixel may be generically called a pixel signal as necessary.

The correlated double sampler (CDS) circuit 130 may sequentially sample and hold the reference signal and the image signal that are transferred from the pixel array 110 to the plurality of column lines. That is, the correlated double sampler (CDS) circuit 130 may sample and hold levels of the reference signal and the image signal that correspond to each column of the pixel array 110.

The correlated double sampler (CDS) circuit 130 may transmit a correlated double sampling (CDS) signal corresponding to the reference signal and the image signal for each column to the ADC circuit 140 upon receiving a control signal from the timing controller 170.

The ADC circuit 140 may receive the CDS signal for each column from the CDS circuit 130, may convert the received CDS signal into a digital signal, and may thus output the digital signal. The ADC circuit 140 may perform counting and calculation operations based on the CDS signal for each column and a ramp signal received from the timing controller 170, such that the ADC circuit 140 may generate digital image data from which noise (for example, unique reset noise for each pixel) corresponding to each column is removed.

The ADC circuit 140 may include a plurality of column counters corresponding to respective columns of the pixel array 110, and may convert the CDS signal for each column into a digital signal using the column counters. In accordance with another embodiment, the ADC circuit 140 may include a single global counter, and may convert a CDS signal corresponding to each column into a digital signal using a global code received from the global counter.

The output buffer 150 may receive image data for each column output from the ADC circuit 140, may capture the received image data, and may output the captured image data. The output buffer 150 may temporarily store image data that is output from the ADC circuit 140 upon receiving a control signal from the timing controller 170. The output buffer 150 may operate as an interface configured to compensate for a difference in transmission speed (or in processing speed) between the image sensor 100 and another device coupled to the image sensor 100.

The column decoder 160 may select a column of the output buffer 150 upon receiving a control signal from the timing controller 170, and the image data temporarily stored in the selected column of the output buffer 150 may be sequentially output. In more detail, the column decoder 160 may receive an address signal from the timing controller 170, may generate a column selection signal based on the received address signal, and may select a column of the output buffer 150, such that the column decoder 160 may control image data from the selected column of the output buffer 150 to be output as an output signal SO.

The timing controller 170 may control the row decoder 120, the ADC circuit 140, the output buffer 150, and the column decoder 160.

The timing controller 170 may transmit a clock signal needed for the constituent elements of the image sensor 100, a control signal needed for timing control, and address signals needed for selection of a row or column to the row decoder 120, the column decoder 160, the ADC circuit 140, and the output buffer 150. In accordance with the embodiment, the timing controller 170 may include a logic control circuit, a phase locked loop (PLL) circuit, a timing control circuit, a communication interface circuit, etc.

Figure 2:
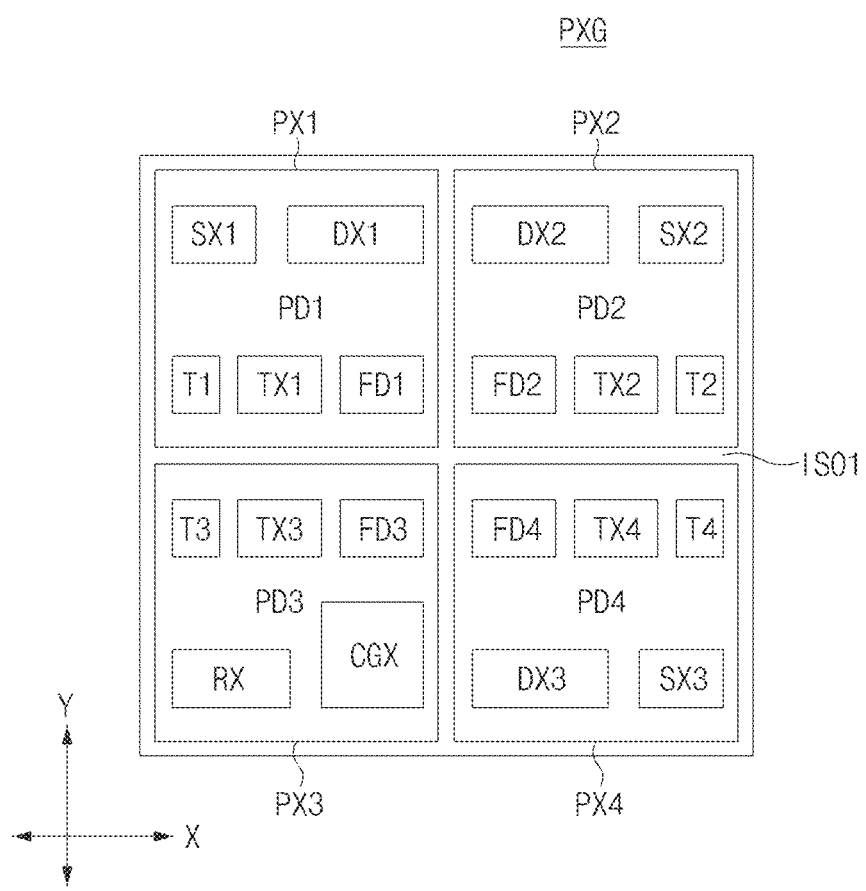
FIG. 2 is an example of a schematic diagram illustrating a layout structure of a pixel group (PXG) shown in FIG. 1 based on some implementations of the disclosed technology.

FIG. 2 is an example of a schematic diagram illustrating a layout structure of the pixel group (PXG) shown in FIG. 1 based on some implementations of the disclosed technology.

Referring to FIG. 2, each pixel group (PXG) may include 4 unit pixels PX1 to PX4. The unit pixels PX1 to PX4 may be arranged contiguous or adjacent to one another in a first direction (X-axis direction) and a second direction (Y-axis direction) perpendicular to the first direction. For example, the unit pixels PX1~PX4 may be arranged in a (2×2) matrix shape.

Each of the unit pixels PX1 to PX4 may be an isolated pixel that is physically isolated from contiguous or adjacent unit pixels by a device isolation structure ISO1. For example, each of the unit pixels PX1 to PX4 is includes its own photoelectric conversion element PD1 to PD4, a single floating diffusion (FD) region FD1 to FD4, or transistors. Thus, any two of the unit pixels do not share photoelectric conversion elements PD1 to PD4, floating diffusion (FD) regions FD1 to FD4, and transistors (TX1 to TX4, DX1 to DX3, SX1 to SX3, RX, CGX).

In some implementations, the device isolation structure ISO1 may include a trench-shaped isolation structure in which a substrate is etched to a predetermined depth and an insulation material fills the etched region. For example, the device isolation structure ISO1 may include a Deep Trench Isolation (DTI) structure, a Shallow Trench Isolation (STI) structure, or a combination thereof.

Electrical connection between elements contained in different unit pixels may be achieved through a conductive line (e.g., a metal line) formed over the substrate.

Each of the unit pixels PX1 to PX4 may include a Back Side Illumination (BSI) structure or a Front Side Illumination (FSI) structure.

Each of the unit pixels PX1 to PX4 may include a single photoelectric conversion element (any one of PD1 to PD4), a single floating diffusion (FD) region (any one of FD1 to FD4), and three transistors. As the example shown in FIG. 2, the types of the transistors included in some unit pixels contained in the pixel group (PXG) can be different from those included in other unit pixels. In FIG. 2, 3 unit pixels PX1, PX2, and PX4 contained in the pixel group (PXG) may include three transistors including a transfer transistor (any one of TX1, TX2, and TX4), a source follower transistor (any one of DX1, DX2, and DX4), and a selection transistor (any one of SX1, SX2, and SX4). The unit pixel PX3 contained in the pixel group (PXG) may include a transfer transistor TX3, a reset transistor RX, and a conversion gain transistor CGX.

In the implementation above, four unit pixels PX1 to PX4 include total 12 transistors including 4 transfer transistors, 3 source follower transistors, 3 selection transistors, a single reset transistor, and a single conversion gain transistor, and each of the unit pixels PX1 to PX4 may include 3 transistors.

As an example, 4 transfer transistors may be formed in the unit pixels PX1 to PX4, respectively. 3 source follower transistors may be formed in three unit pixels PX1, PX2 and PX4, respectively. 3 selection transistors may be formed in three unit pixels PX1, PX2 and PX4, respectively. A single reset transistor and a single conversion gain transistor may be formed in the remaining unit pixel PX3 in which the source follower transistor and the selection transistor are not formed.

The photoelectric conversion elements PD1 to PD4 may be respectively formed in the corresponding unit pixels PX1 to PX4 on a one to one basis. The photoelectric conversion elements PD1 to PD4 may generate photocharges by performing photoelectric conversion of incident light. Each unit pixel includes a photoelectric conversion element which includes, for example, a photodiode, a photogate, a phototransistor, a photoconductor, or some other photosensing structures capable of generating photocharges.

The floating diffusion (FD) regions FD1 to FD4 may receive photocharges generated by the photoelectric conversion elements PD1 to PD4 through the transfer transistors TX1 to TX4, and may temporarily store the received photocharges. The floating diffusion (FD) regions FD1 to FD4 may be electrically coupled to each other through conductive lines. Thus, the unit pixels PX1 to PX4 contained in the pixel group (PXG) may be configured to share the floating diffusion (FD) regions FD1 to FD4 and have a 4-shared pixel structure.

The length of the conductive lines that electrically couple the floating diffusion (FD) regions to one another depends on the arrangement of the floating diffusion (FD) regions connected through the conductive lines. In order to minimize the length of conductive lines by which the floating diffusion (FD) regions FD1 to FD4 are coupled to each other, the floating diffusion (FD) regions may be positioned as close as possible in the pixel group (PXG). For example, the floating diffusion (FD) regions FD1 to FD4 may be located closest to each other within the pixel group (PXG). For example, the floating diffusion (FD) regions FD1 to FD4 may be arranged around corner regions of the corresponding unit pixels PX1 to PX4 such that the floating diffusion regions FD1 to FD4 can meet around the center portion of the pixel group (PXG).

In the unit pixels (PX1 to PX4), the transfer transistors TX1 to TX4 may be arranged contiguous or adjacent to the floating diffusion (FD) regions FD1 to FD4 in the first direction. In the unit pixels PX1, PX2, and PX4, the source follower transistors DX1 to DX3 may be arranged contiguous or adjacent to the floating diffusion (FD) regions FD1, FD2, and FD4 in the second direction, and the selection transistors SX1 to SX3 may be arranged contiguous or adjacent to the source follower transistors DX1 to DX3 in the first direction. In the unit pixel PX3, the conversion gain transistor CGX may be arranged contiguous or adjacent to the floating diffusion (FD) region FD3 in the second direction, and the reset transistor RX may be arranged contiguous or adjacent to the conversion gain transistor CGX in the first direction.

The unit pixels PX1 to PX4 may include tap regions T1 to T4, respectively. The tap regions T1 to T4 may be located at one side of the transfer transistors TX1 to TX4 in the first direction. Thus, the tap regions T1 to T4 may be respectively located opposite to the floating diffusion (FD) regions FD1 to FD4. Here, each of the tap regions T1 to T4 may apply a bias voltage to a well region of the substrate.

As described above, the unit pixels PX1, PX2, and PX4 may include the same constituent elements. In this case, the constituent elements contained in the unit pixel PX1 and the constituent elements contained in the unit pixel PX2 may be arranged symmetrical to each other with respect to a boundary region between the unit pixel PX1 and the unit pixel PX2. In addition, the constituent elements contained in the unit pixel PX2 and the constituent elements contained in the unit pixel PX4 may be arranged symmetrical to each other with respect to a boundary region between the unit pixel PX2 and the unit pixel PX4.

Although FIG. 2 illustrates an exemplary case in which the reset transistor RX and the conversion gain transistor CGX are formed in the unit pixel PX3 for convenience of description, such implementation is provided as one example only and other implementations are also possible. For example, the reset transistor RX and the conversion gain transistor CGX may be formed in any one of the unit pixels PX1, PX2, and PX4, and the selection transistor and the source follower transistor may be formed in the unit pixel PX3.

Figure 3:
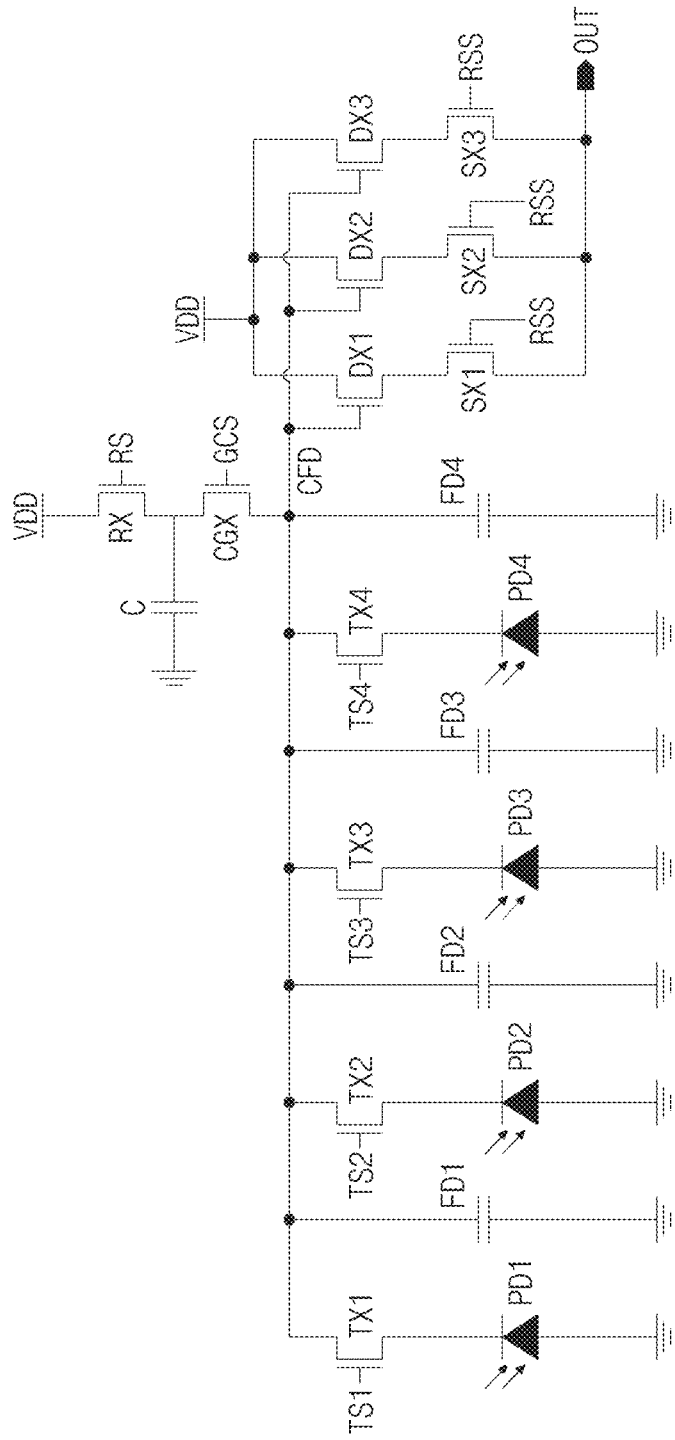
FIG. 3 is an example of an equivalent circuit diagram illustrating an equivalent circuit corresponding to the pixel group (PXG) shown in FIG. 1 based on some implementations of the disclosed technology.

FIG. 3 is an example of an equivalent circuit diagram illustrating an equivalent circuit corresponding to the pixel group (PXG) shown in FIG. 1 based on some implementations of the disclosed technology.

Referring to FIG. 3, the pixel group (PXG) may include photoelectric conversion elements PD1 to PD4, floating diffusion regions FD1 to FD4, transfer transistors TX1 to TX4, source follower transistors DX1 to DX3, selection transistors SX1 to SX3, a reset transistor RX, a conversion gain transistor CGX, and a conversion gain capacitor C.

Each of the photoelectric conversion elements PD1 to PD4 may perform photoelectric conversion of incident light, and may thus generate photocharges corresponding to the amount of incident light. Each of the photoelectric conversion elements PD1 to PD4 may be implemented as a photodiode, a phototransistor, a photogate, a pinned photodiode, or a combination thereof.

The transfer transistors TX1 to TX4 may be coupled to the photoelectric conversion elements PD1 to PD4 and the floating diffusion regions FD1 to FD4. In some implementations, the transfer transistor TX1 may be coupled to the photoelectric conversion element PD1 and the floating diffusion region FD1, the transfer transistor TX2 may be coupled to the photoelectric conversion element PD2 and the floating diffusion region FD2, the transfer transistor TX3 may be coupled to the photoelectric conversion element PD3 and the floating diffusion region FD3, and the transfer transistor TX4 may be coupled to the photoelectric conversion element PD4 and the floating diffusion region FD4. Thus, one terminal of each transfer transistor TX1 to TX4 may be coupled to the photoelectric conversion element PD1 to PD4 in the same unit pixel, and the other terminal of each transfer transistor TX1 to TX4 may be coupled to the floating diffusion region FD1 to FD4 in the same unit pixel. The transfer transistors TX1 to TX4 may be turned on or off in response to transmission signals TS1 to TS4 applied to gate terminals thereof, such that the transfer transistors TX1 to TX4 may transmit photocharges generated by the photoelectric conversion elements PD1 to PD4 to the corresponding floating diffusion regions FD1 to FD4.

The floating diffusion regions FD1 to FD4 may be electrically and commonly coupled to each other through conductive lines, resulting in formation of a common floating diffusion (CFD) node. The common floating diffusion (CFD) node may be modeled as a single junction capacitor coupled in parallel to the floating diffusion regions FD1 to FD4. Capacitance of the common floating diffusion (CFD) node may be denoted by the sum of capacitances of the floating diffusion regions FD1 to FD4. The common floating diffusion (CFD) node may receive photocharges of the photoelectric conversion elements PD1 to PD4 through the transfer transistors TX1 to TX4, and may temporarily store the received photocharges.

The source follower transistors DX1 to DX3 may be coupled to a power-supply voltage (VDD) node and the selection transistors SX1 to SX3 corresponding thereto. In some implementations, one terminal of the source follower transistor DX1 may be coupled to the power-supply voltage (VDD) node and the other terminal of the source follower transistor DX1 may be coupled to the selection transistor SX1 belonging to the same unit pixel, one terminal of the source follower transistor DX2 may be coupled to the power-supply voltage (VDD) node and the other terminal of the source follower transistor DX2 may be coupled to the selection transistor SX2 belonging to the same unit pixel, and one terminal of the source follower transistor DX3 may be coupled to the power-supply voltage (VDD) node and the other terminal of the source follower transistor DX3 may be coupled to the selection transistor SX3 belonging to the same unit pixel. The source follower transistors DX1 to DX3 may be coupled to the common floating diffusion (CFD) node through gate terminals thereof, may generate a signal corresponding to the magnitude of an electric potential of the common floating diffusion (CFD) node, and may output the generated signal to the corresponding selection transistors SX1 to SX3. Thus, each of the source follower transistors DX1 to DX3 may amplify a potential change of the common floating diffusion (CFD) node, and may output the amplified potential to the selection transistors SX1 to SX3.

The selection transistors SX1 to SX3 may be respectively coupled to the source follower transistors DX1 to DX3 corresponding thereto, and each of the selection transistors SX1 to SX3 may be coupled to an output node (OUT). The selection transistors SX1 to SX3 may be turned on or off in response to the row selection signal (RSS) applied to gate terminals thereof, such that the selection transistors SX1 to SX3 may transmit output signals of the source follower transistors DX1 to DX3 to the output node (OUT). The output node (OUT) may be coupled to column lines. The selection transistors SX1 to SX3 according to the present embodiment may be commonly coupled to the single output node (OUT), and may receive the same row selection signal (RSS) through gate terminals thereof, such that the selection transistors SX1 to SX3 may operate as a single transistor having a relatively large channel width.

The reset transistor RX and the conversion gain transistor CGX may be coupled in series between the power-supply voltage (VDD) node and the common floating diffusion (CFD) node. The conversion gain capacitor (C) for adjusting capacitance of the common floating diffusion (CFD) node may be coupled to a common node of the reset transistor RX and the conversion gain transistor CGX. The reset transistor RX may be turned on or off in response to the reset signal (RS) applied to a gate terminal thereof, such that the reset transistor RX may reset the common floating diffusion (CFD) node to a power-supply voltage (VDD) level. The conversion gain transistor CGX may enable the conversion gain capacitor (C) to be selectively coupled in parallel to the common floating diffusion (CFD) node in response to the gain control signal GCS applied to a gate terminal thereof, such that the conversion gain transistor CGX can adjust capacitance of the common floating diffusion (CFD) node. The gain control signal GCS may be received from the row decoder 120.

FIGS. 4A to 4D are schematic diagrams illustrating layout structures of unit pixels PX1 to PX4 contained in the pixel group (PXG) shown in FIG. 2 based on some implementations of the disclosed technology.

In the substrate, a region in which unit pixels are formed may be defined by a device isolation structure ISO1. The device isolation structure ISO1 may be formed in a boundary region of contiguous or adjacent unit pixels, such that the device isolation structure ISO1 may physically isolate the contiguous or adjacent unit pixels from each other. The device isolation structure ISO1 may include a DTI structure and/or a combination structure of the DTI structure and the STI structure. For example, the substrate in which photoelectric conversion elements of the unit pixel are formed may include a first surface upon which light is incident and a second surface that faces the first surface and includes pixel transistors TX1, DX1, and SX1. The device isolation structure ISO1 may include a Front Deep Trench Isolation (FDTI) structure in which a trench formed by etching the substrate to a predetermined depth in the direction from the second surface to the first surface is filled with an insulation material.

The unit pixel PX1 may include active regions ACT11 and ACT12 that are defined by a device isolation structure ISO21. The active region ACT11 may include a selection transistor SX1, a source follower transistor DX1, and a transfer transistor TX1. For example, the selection transistor SX1, the source follower transistor DX1, and the transfer transistor TX1 may be formed to share the same active region ACT11. A tap region T1 may be formed in the active region ACT12. The device isolation structure ISO21 may be formed to have a shallow trench isolation (STI) structure in which a trench formed by etching the substrate to a predetermined depth is filled with an insulation material.

The selection transistor SX1 may include a selection gate SG1 formed over the active region ACT11. In the active region ACT11, the active region at one side of the selection gate SG1 may be coupled to the output node OUT through conductive lines, and the active region at the other side of the selection gate SG1 may be coupled to the source follower transistor DX1. The selection gate SG1 may receive the row selection signal RSS through conductive lines.

The source follower transistor DX1 may include a drive gate DG1 formed over the active region ACT11. In the active region ACT11, the active region at one side of the drive gate DG1 may be coupled to the power-supply voltage (VDD) node through conductive lines, and the active region at the other side of the drive gate DG1 may be coupled to the selection transistor SX1. In this case, the selection transistor SX1 and the source follower transistor DX1 may not be electrically coupled to each other through conductive lines, and may be electrically coupled to each other by sharing the active region ACT11. The drive gate DG1 may be coupled to the common floating diffusion (CFD) node through conductive lines.

The transfer transistor TX1 may include a transfer gate TG1 formed over the active region ACT11. The transfer transistor TX1 may be a transistor in which the photoelectric conversion element PD1 and the floating diffusion (FD) region FD1 are used as source/drain regions. In this case, the transfer gate TG1 may be buried to a predetermined depth in the substrate, and may be formed in a recess gate shape that forms a vertical channel region between the photoelectric conversion element PD1 and the floating diffusion (FD) region FD1 in response to the transmission signal TS1.

The transfer gate TG1 may be formed in the active region ACT11. Thus, in the active region ACT11, the floating diffusion (FD) region FD1 may be formed at one side of the transfer gate TG1, and the selection transistor SX1 and the source follower transistor DX1 may be coupled to the other side of the transfer gate TG1. For example, the active region ACT11 may be formed in a T-shaped structure in which three branches are commonly coupled to each other and each of the three branches is bent. Each of the selection gate SG1, the drive gate DG1, and the transfer gate TG1 may be formed at the center portion of each branch. In this case, in the active region ACT11, whereas a specific region in which the transfer transistor TX1 is formed is physically coupled to another region in which the selection transistor SX1 and the source follower transistor SX1 are formed, through the active region ACT11, it should be noted that the specific region is not electrically coupled to the above another region. For example, impurities for forming the source/drain regions of the transistor may not be implanted into the center portion of the unit pixel PX1 from among the active region ACT11. As a result, although the transfer gate TG1 is turned on, the floating diffusion (FD) region FD1 may not be electrically coupled to the selection transistor SX1 or the source follower transistor DX1.

The transfer gate TG1 may receive the transmission signal TS1 through conductive lines. The floating diffusion (FD) region FD1 may be coupled to the common floating diffusion (CFD) node through conductive lines.

The tap region T1 may be used to apply a bias voltage to the well region of the substrate, and may be formed in the active region ACT12 that is isolated from the active region ACT11 by the device isolation structure ISO21. The active region ACT12 may be formed in an island shape at the corner region of the unit pixel PX1. The tap region T1 may be coupled to a bias voltage (BV) node through conductive lines.

The unit pixel PX2 may be arranged contiguous or adjacent to the unit pixel PX1 in the first direction. The unit pixel PX2 may include active regions ACT21 and ACT22 defined by a device isolation structure ISO22. The active region ACT21 may include a selection transistor SX2, a source follower transistor DX2, and a transfer transistor TX2. For example, the selection transistor SX2, the source follower transistor DX2, and the transfer transistor TX2 may be formed to share the same active region ACT21. The active region ACT22 may include a tap region T2.

The unit pixel PX2 may include a layout structure that is symmetrical to the unit pixel PX1 in the first direction with respect to a boundary region between the unit pixel PX2 and the unit pixel PX1. For example, the active regions ACT21 and ACT22 of the unit pixel PX2 may be respectively arranged symmetrical to the active regions ACT11 and ACT12 of the unit pixel PX1 in the first direction. The gates SG2, DG2, and TG2 of the unit pixel PX2 may be formed over the active region ACT21 in a manner that the gates SG2, DG2, and TG2 of the unit pixel PX2 are arranged symmetrical to the gates SG1, DG1, and TG1 of the unit pixel PX1 in the first direction. The transistors SX2, DX2, and TX2 of the unit pixel PX2 may be identical in structure to the transistors SX1, DX1, and TX1 of the unit pixel PX1, and may also be identical in function to the transistors SX1, DX1, and TX1 of the unit pixel PX2.

The tap region T2 of the unit pixel PX2 may be arranged symmetrical to the tap region T1 of the unit pixel PX1 in the first direction. The tap region T2 may be formed in the active region ACT22 that is isolated from the active region ACT21 by the device isolation structure ISO22. The active region ACT22 may be formed in the island shape at the corner region of the unit pixel PX2. The tap region T2 may be coupled to the bias voltage (BV) node through conductive lines.

The unit pixel PX3 may be arranged contiguous or adjacent to the unit pixel PX1 in the second direction. The unit pixel PX3 may include active regions ACT31 and ACT32 that are defined by a device isolation structure ISO23. The active region ACT31 may include a transfer transistor TX3, a reset transistor RX, and a conversion gain transistor CGX. For example, the transfer transistor TX3, the reset transistor RX, and the conversion gain transistor CGX may be formed to share the same active region ACT31. The active region ACT32 may include a tap region T3.

The transfer transistor TX3 may include a transfer gate TG3 formed in the active region ACT31. The transfer gate TG3 may include a recess gate that forms a vertical channel region between the photoelectric conversion element PD3 and the floating diffusion (FD) region FD3 in response to a transmission signal TS3.

In the active region ACT31, the floating diffusion (FD) region FD3 may be formed at one side of the transfer gate TG3, and the other side of the transfer gate TG3 may be coupled to the reset transistor RX and the conversion gain transistor CGX. The transfer gate TG3 may receive the transmission signal TS3 through conductive lines. The floating diffusion (FD) region FD3 may be coupled to the common floating diffusion (CFD) node through conductive lines.

The reset transistor RX may include a reset gate RG formed over the active region ACT31. In the active region ACT31, the active region at one side of the reset gate RG may be coupled to the power-supply voltage (VDD) node through conductive lines, and the active region at the other side of the reset gate RG may be coupled to the conversion gain transistor CGX and the conversion gain capacitor (C). In this case, the reset transistor RX may be coupled to the conversion gain transistor CGX by sharing the active region ACT31 with the conversion gain transistor CGX, and may be coupled to the conversion gain capacitor (C) through conductive lines. The reset gate RG may receive the reset signal (RS) through conductive lines.

The conversion gain transistor CGX may include a conversion gate CG formed over the active region ACT31. In the active region ACT31, the floating diffusion (FD) region FD3 may be formed at one side of the conversion gate CG, and the other side of the conversion gate CG may be coupled to the reset transistor RX and the conversion gate capacitor (C). In this case, the conversion gain transistor CGX may be coupled to the reset transistor RX by sharing the active region ACT31 with the reset transistor RX, and may be coupled to the conversion gain capacitor (C) through conductive lines. The conversion gate CG may receive a gain control signal (GCS) through conductive lines.

An impurity region VSS coupled to the conversion gain capacitor (C) may be partially formed in the center portion of the unit pixel PX3 from among the active region ACT31. For example, the impurity region VSS may be used to ground one terminal of the conversion gain capacitor (C).

The tap region T3 may be arranged symmetrical to the tap region T1 of the unit pixel PX1 in the second direction. The tap region T3 may be formed in the active region ACT32 that is isolated from the active region ACT31 by the device isolation structure ISO23. The active region ACT32 may be formed in an island shape at the corner region of the unit pixel PX3. The tap region T3 may be coupled to the bias voltage (BV) node through conductive lines.

The unit pixel PX4 may be arranged contiguous or adjacent to the unit pixel PX3 in the first direction, and may also be arranged contiguous or adjacent to the unit pixel PX2 in the second direction. The unit pixel PX4 may include active regions ACT41 and ACT42 defined by a device isolation structure ISO24. The active region ACT41 may include a selection transistor SX3, a source follower transistor DX3, and a transfer transistor TX4. For example, the selection transistor SX3, the source follower transistor DX3, and the transfer transistor TX4 may be formed to share the same active region ACT41. The active region ACT42 may include a tap region T4.

The unit pixel PX4 may include a layout structure that is symmetrical to the unit pixel PX2 in the second direction with respect to a boundary region between the unit pixel PX4 and the unit pixel PX2. For example, the active regions ACT41 and ACT42 may be arranged symmetrical to the active regions ACT21 and ACT22 of the unit pixel PX2 in the second direction. The gates SG3, DG3, and TG4 of the unit pixel PX4 may be formed over the active region ACT41 in a manner that the gates SG3, DG3, and TG4 of the unit pixel PX4 are arranged symmetrical to the gates SG2, DG2, and TG2 of the unit pixel PX2 in the second direction. That is, the transistors SX3, DX3, and TX4 of the unit pixel PX4 may be arranged symmetrical to the transistors SX2, DX2, and TX2 of the unit pixel PX2 in the second direction. The transistors SX3, DX3, and TX4 of the unit pixel PX4 may be identical in structure to the transistors SX2, DX2, and TX2 of the unit pixel PX2, and may also be identical in function to the transistors SX2, DX2, and TX2 of the unit pixel PX2.

The tap region T4 may be arranged symmetrical to the tap region T2 of the unit pixel PX2 in the second direction. The tap region T4 may be formed in the active region ACT42 that is isolated from the active region ACT41 by the device isolation structure ISO24. The active region ACT42 may be formed in an island shape at the corner region of the unit pixel PX4. The tap region T4 may be coupled to the bias voltage (BV) node through conductive lines.

Figure 4A:
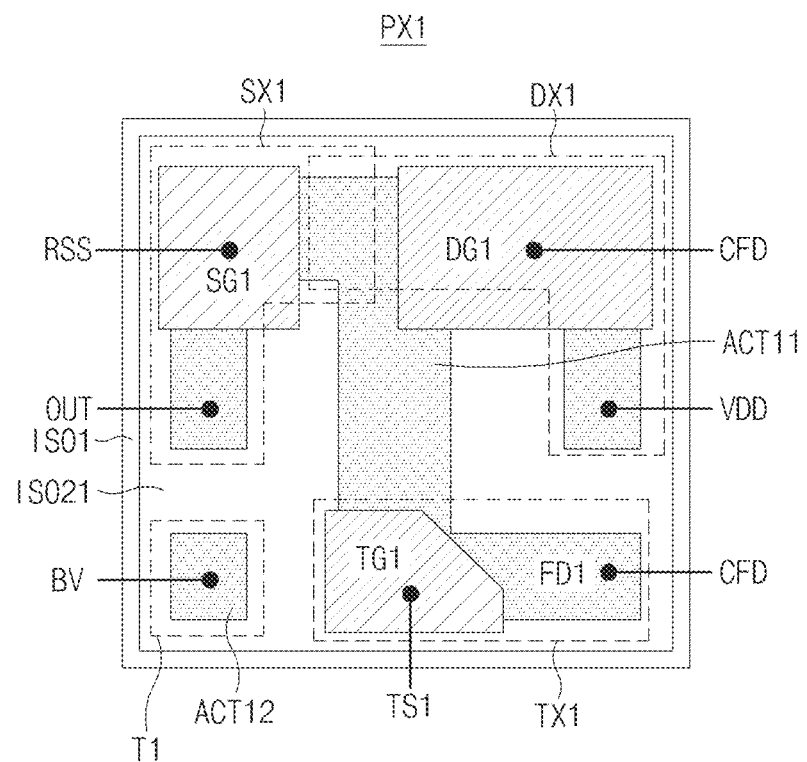
FIG. 4A is an example of a schematic diagram illustrating a layout structure of a unit pixel (PX1) contained in the pixel group (PXG) shown in FIG. 2 based on some implementations of the disclosed technology.
Figure 4B:
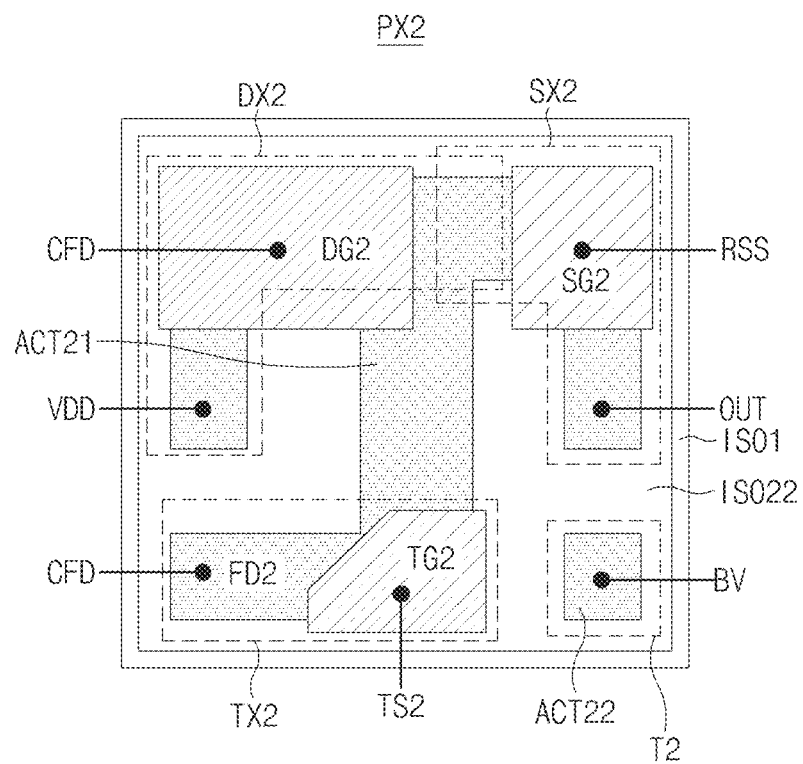
FIG. 4B is an example of a schematic diagram illustrating a layout structure of a unit pixel (PX2) contained in the pixel group (PXG) shown in FIG. 2 based on some implementations of the disclosed technology.
Figure 4C:
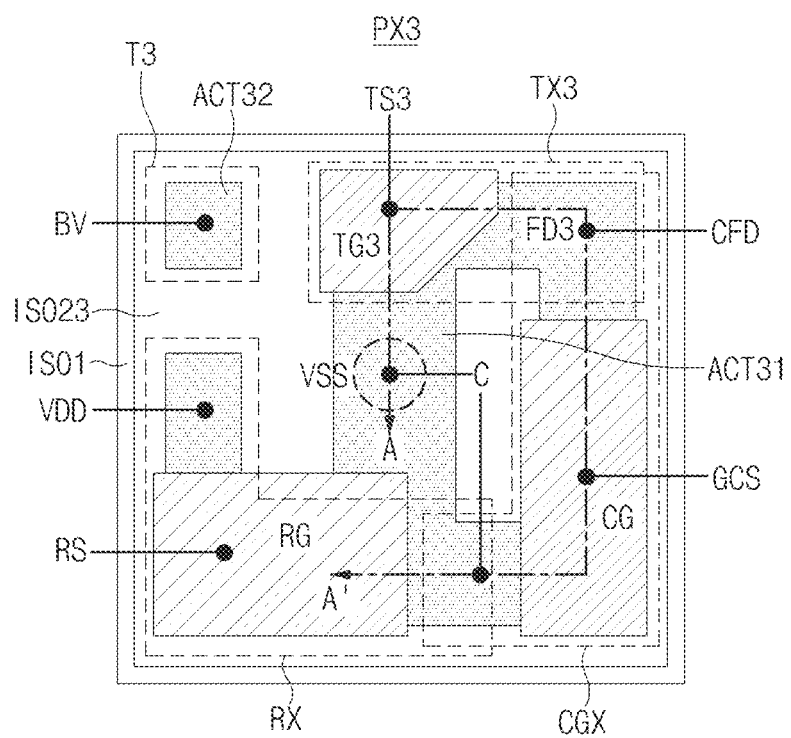
FIG. 4C is an example of a schematic diagram illustrating a layout structure of a unit pixel (PX3) contained in the pixel group (PXG) shown in FIG. 2 based on some implementations of the disclosed technology.
Figure 4D:
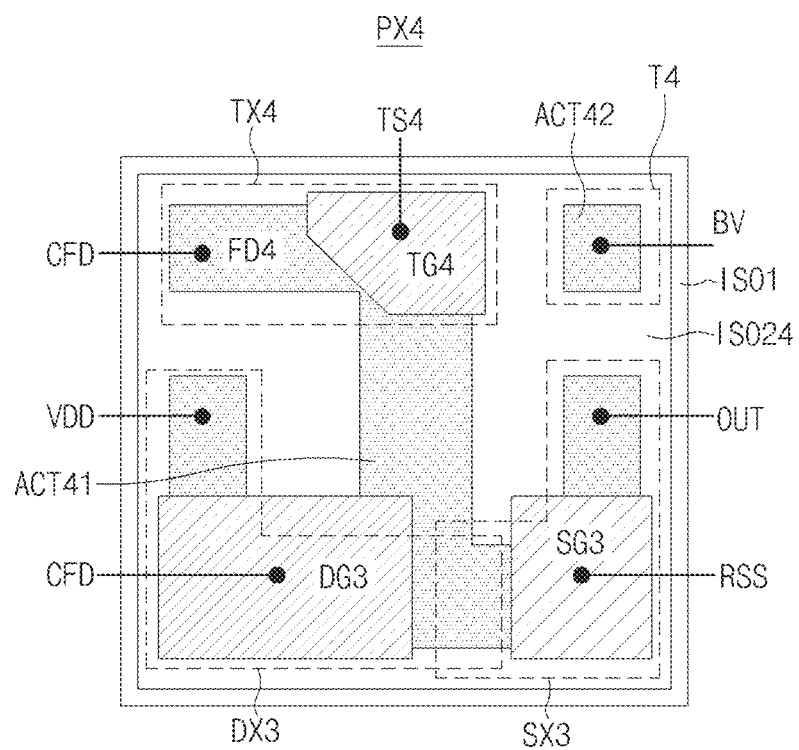
FIG. 4D is an example of a schematic diagram illustrating a layout structure of a unit pixel (PX4) contained in the pixel group (PXG) shown in FIG. 2 based on some implementations of the disclosed technology.
Figure 5:
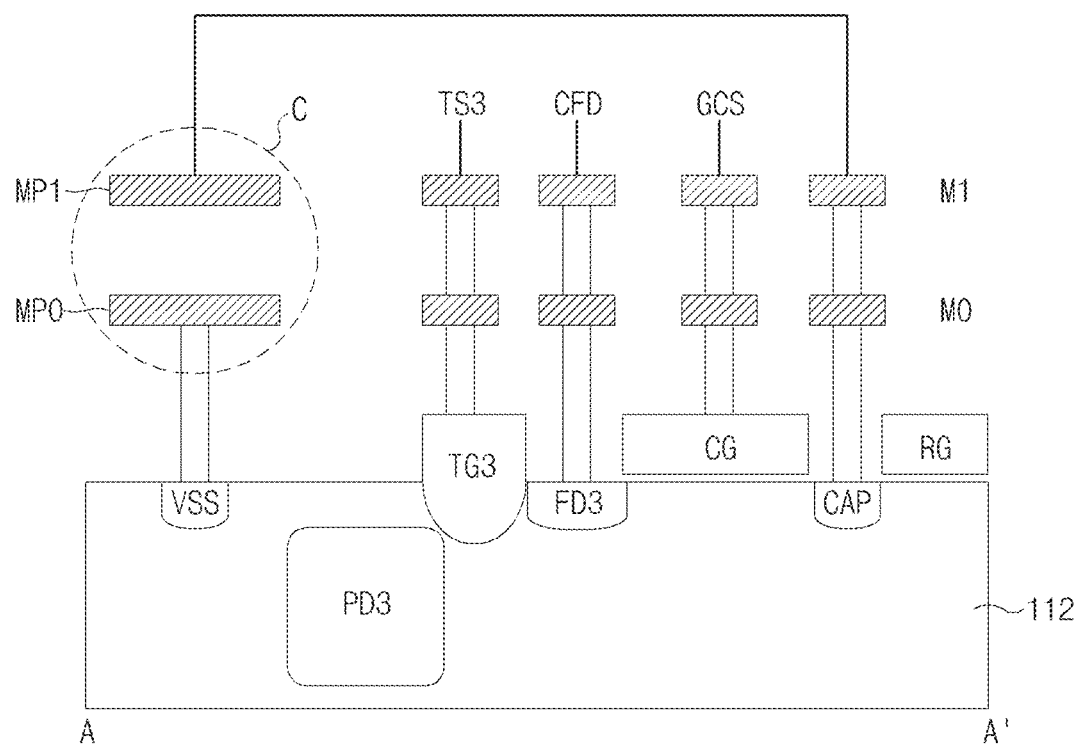
FIG. 5 is a cross-sectional view illustrating an example of a unit pixel taken along the line A-A' shown in FIG. 4C based on some implementations of the disclosed technology.

FIG. 5 is a cross-sectional view illustrating an example of the unit pixel taken along the line A-A' shown in FIG. 4C. In more detail, FIG. 5 exemplarily illustrates a method for forming the conversion gain capacitor.

Referring to FIG. 5, the conversion gain capacitor (C) may be formed over the active region ACT31 in the unit pixel PX3. For example, the conversion gain capacitor (C) may include a Metal-Insulator-Metal (MIM) capacitor in which an insulation material is formed between two metal plates MP0 and MP1 over the active region ACT31.

In this case, the metal plate MP0 may correspond to a lower electrode of the conversion gain capacitor (C), and may be formed simultaneously with formation of conductive lines of the metal layer M0. The metal plate MP1 may correspond to an upper electrode of the conversion gain capacitor (C), and may be formed simultaneously with formation of conductive lines of the metal layer M1. The metal plate MP0 may be coupled to the impurity region VSS, and the metal plate MP1 may be coupled to an impurity region CAP formed between the conversion gate CG and the reset gate RG.

Although FIG. 5 illustrates an exemplary case in which the conversion gain capacitor (C) for minimizing the length of conductive lines through which the conversion gain capacitor (C) is coupled to the conversion gate transistor CGX is formed in the unit pixel PX3 for convenience of description, other implementations are also possible. For example, the conversion gain capacitor (C) may be formed anywhere in a redundant space where the conductive lines are not formed within the pixel group (PXG).

Although FIG. 5 exemplarily illustrates only one conversion gain capacitor (C) for convenience of description, the number of the conversion gain capacitor is not limited 1. In some implementations, several conversion gain capacitors can also be coupled in parallel to each other.

As is apparent from the above description, the image sensing device based on some implementations of the disclosed technology can improve operational characteristics thereof.

The image sensing device based on some implementations of the disclosed technology can adjust a conversion gain without increasing the size of pixels within a shared structure in which a plurality of pixels shares floating diffusion (FD) regions.

Those skilled in the art will appreciate that the embodiments may be carried out in other specific ways than those set forth herein. The above embodiments are therefore to be construed in all aspects as illustrative and not restrictive. In addition, those skilled in the art will understand that claims that are not explicitly cited in each other in the appended claims may be presented in combination as an embodiment or included as a new claim by a subsequent amendment after the application is filed.

Although a number of illustrative embodiments have been described, it should be understood that modifications to the disclosed embodiments and other embodiments may be made based on the disclosure of this patent document.

What is claimed is:

1. An image sensing device comprising:
a first unit pixel including a first photoelectric conversion element configured to generate photocharges in response to incident light, and a first floating diffusion region configured to receive photocharges generated by the first photoelectric conversion element;
a second unit pixel including a second photoelectric conversion element configured to generate photocharges in response to incident light, and a second floating diffusion region configured to receive photocharges generated by the second photoelectric conversion element;
a third unit pixel including a third photoelectric conversion element configured to generate photocharges in response to incident light, and a third floating diffusion region configured to receive photocharges generated by the third photoelectric conversion element; and
a fourth unit pixel including a fourth photoelectric conversion element configured to generate photocharges in response to incident light, and a fourth floating diffusion region configured to receive photocharges generated by the fourth photoelectric conversion element, wherein
the first to fourth unit pixels are isolated from each other by a first device isolation structure,
the first to fourth floating diffusion regions are coupled to a common floating diffusion node through conductive lines, and
at least one unit pixel among the first to fourth unit pixels includes a conversion gain transistor coupled to the common floating diffusion node and configured to adjust capacitance of the common floating diffusion node in response to a gain control signal provided to the conversion gain transistor.

2. The image sensing device according to claim 1, wherein the first device isolation structure includes a deep trench isolation (DTI) structure.

3. The image sensing device according to claim 1, wherein the at least one unit pixel further includes:
a conversion gain capacitor coupled to the conversion gain transistor.

4. The image sensing device according to claim 3, wherein the conversion gain capacitor includes a metal-insulator-metal (MIM) capacitor.

5. The image sensing device according to claim 1, wherein each of the first to fourth unit pixels further includes:
a transfer transistor configured to transmit photocharges generated by a corresponding photoelectric conversion element to a corresponding floating diffusion region.

6. The image sensing device according to claim 5, wherein the at least one unit pixel further includes:
a reset transistor configured to reset the common floating diffusion node in response to a reset signal provided to the reset transistor.

7. The image sensing device according to claim 6, wherein:
the at least one unit pixel includes a first active region and a second active region that are defined by a second device isolation structure,
wherein the conversion gain transistor, the transfer transistor, and the reset transistor are formed to share the first active region.

8. The image sensing device according to claim 7, wherein the second active region includes:
a tap region configured to receive a bias voltage as an input.

9. The image sensing device according to claim 5, wherein each of remaining unit pixels among the first to fourth unit pixels other than the at least one unit pixel further includes:
a source follower transistor configured to generate a signal corresponding to a magnitude of electric potential of the common floating diffusion node, and output the generated signal; and
a selection transistor configured to transmit an output signal of the source follower transistor to an output node in response to a selection signal.

10. The image sensing device according to claim 9, wherein:
each of the remaining unit pixels includes a first active region and a second active region that are defined by a second device isolation structure; and
the transfer transistor, the source follower transistor, and the selection transistor are formed to share the first active region.

11. The image sensing device according to claim 10, wherein the second active region includes:
a tap region configured to receive a bias voltage as an input.

12. An image sensing device comprising:
a plurality of pixel groups arranged in a first direction and a second direction perpendicular to the first direction,
wherein each pixel group includes unit pixels that are isolated from one another by a first device isolation structure,
wherein each of the unit pixels includes:
a photoelectric conversion element configured to generate photocharges by performing photoelectric conversion of incident light;

a floating diffusion region configured to receive the photocharges; and a transfer transistor configured to transmit the photocharges generated by the photoelectric conversion element to the floating diffusion region, wherein the floating diffusion regions of the unit pixels are coupled to a common floating diffusion node through conductive lines; and at least one of the unit pixels includes a conversion gain transistor configured to adjust capacitance of the common floating diffusion node in response to a gain control signal provided to the conversion gain transistor.

13. The image sensing device according to claim 12, wherein each of the unit pixels includes:

a first active region and a second active region that are defined by a second device isolation structure.

14. The image sensing device according to claim 13, wherein the second active region includes:

a tap region configured to receive a bias voltage as an input.

15. The image sensing device according to claim 13, wherein the at least one unit pixel further includes:

a conversion gain capacitor in which a lower electrode is coupled to a first active region of the at least one unit pixel and an upper electrode is coupled to the conversion gain transistor.

16. The image sensing device according to claim 12, wherein the at least one unit pixel further includes:

a reset transistor configured to reset the common floating diffusion node in response to a reset signal.

17. The image sensing device according to claim 16, wherein the at least one unit pixel includes the transfer transistor, the conversion gain transistor, and the reset transistor that are configured to share the first active region.

18. The image sensing device according to claim 12, wherein each of remaining unit pixels other than the at least one unit pixel further includes:

a source follower transistor configured to generate a signal corresponding to a magnitude of electric potential of the common floating diffusion node, and to output the generated signal; and a selection transistor configured to transmit an output signal of the source follower transistor to an output node in response to a selection signal.

19. The image sensing device according to claim 18, wherein each of the remaining unit pixels includes the transfer transistor, the source follower transistor, and the selection transistor that are configured to share the first active region.

20. The image sensing device according to claim 19, wherein the remaining unit pixels include two adjacent unit pixels arranged such that transfer transistors, source follower transistors, and selection transistors of the two adjacent unit pixels are symmetrical to one another with respect to a boundary region between the two adjacent unit pixels.

* * * * *